United States Patent
Ilani et al.

(10) Patent No.: US 10,069,094 B2
(45) Date of Patent: Sep. 4, 2018

(54) NANOTUBE BASED TRANSISTOR STRUCTURE, METHOD OF FABRICATION AND USES THEREOF

(71) Applicant: YEDA RESEARCH AND DEVELOPMENT CO. LTD., Rehovot (IL)

(72) Inventors: Shahal Ilani, Rehovot (IL); Sharon Pecker, Rehovot (IL); Avishai Benyamini, Rehovot (IL); Jonah Waissman, Rehovot (IL); Assaf Hamo, Rehovot (IL); Maayan Honig, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 3 days.

(21) Appl. No.: 15/034,186

(22) PCT Filed: Nov. 6, 2014

(86) PCT No.: PCT/IL2014/050966
§ 371 (c)(1),
(2) Date: May 4, 2016

(87) PCT Pub. No.: WO2015/068162
PCT Pub. Date: May 14, 2015

(65) Prior Publication Data
US 2016/0285018 A1    Sep. 29, 2016

Related U.S. Application Data

(60) Provisional application No. 61/900,439, filed on Nov. 6, 2013.

(51) Int. Cl.
*H01L 51/05* (2006.01)
*H01L 29/06* (2006.01)
(Continued)

(52) U.S. Cl.
CPC .......... *H01L 51/0558* (2013.01); *H01L 22/14* (2013.01); *H01L 29/0673* (2013.01);
(Continued)

(58) Field of Classification Search
CPC ........... H01L 29/1029; H01L 29/66045; H01L 29/772; H01L 29/0673; H01L 51/0024;
(Continued)

(56) References Cited

U.S. PATENT DOCUMENTS

2009/0212279 A1    8/2009   Liu et al.
2009/0278116 A1*  11/2009   Yamate ............... H01L 51/0003
                                                              257/40
(Continued)

FOREIGN PATENT DOCUMENTS

EP          2120274         11/2009

*Primary Examiner* — Daniel Luke
(74) *Attorney, Agent, or Firm* — Mark S. Cohen; Pearl Cohen Zedek Latzer Baratz LLP

(57) ABSTRACT

A method for use in construction of an electronic device and a transistor structure are presented. The method comprising: providing one or more nanotubes grown on a surface of a first substrate; providing a desired electrode arrangement fabricated on a surface of a second substrate. The electrode arrangement comprises at least two elevated source and drain electrodes and one or more gate electrodes located in between said elevated source and drain electrodes. The method also comprises bringing the electrode arrangement on the second substrate to close proximity with the first substrate such that surfaces of the first and second substrates face each other; scanning said first substrate with said electrode arrangement and determining contact of electrodes of the electrode arrangement with a nanotube located on the first substrate; and detaching said nanotube from the first substrate to provide a transistor structure comprising an isolated nanotube between the source and drain electrodes.

15 Claims, 10 Drawing Sheets

(51) Int. Cl.
  *H01L 21/66* (2006.01)
  *H01L 51/00* (2006.01)
  *H01L 29/10* (2006.01)
  *H01L 29/66* (2006.01)
  *H01L 29/772* (2006.01)
  *H01L 51/10* (2006.01)
  *C01B 32/16* (2017.01)

(52) U.S. Cl.
  CPC .... *H01L 29/1029* (2013.01); *H01L 29/66045* (2013.01); *H01L 29/772* (2013.01); *H01L 51/003* (2013.01); *H01L 51/0012* (2013.01); *H01L 51/0024* (2013.01); *H01L 51/0031* (2013.01); *H01L 51/0045* (2013.01); *H01L 51/0048* (2013.01); *H01L 51/0508* (2013.01); *H01L 51/105* (2013.01); *C01B 32/16* (2017.08)

(58) Field of Classification Search
  CPC ............... H01L 51/003; H01L 51/0031; H01L 51/0048; H01L 51/0508; H01L 51/105; H01L 22/14
  See application file for complete search history.

(56) References Cited

U.S. PATENT DOCUMENTS

| | | | |
|---|---|---|---|
| 2010/0127242 | A1 | 5/2010 | Zhou et al. |
| 2013/0119345 | A1 | 5/2013 | Park et al. |
| 2016/0056304 | A1* | 2/2016 | Kim ........................ H01L 29/78 257/192 |

* cited by examiner

NANOTUBE BASED TRANSISTOR STRUCTURE, METHOD OF FABRICATION AND USES THEREOF

CROSS-REFERENCE TO RELATED APPLICATIONS

This application is a National Phase Application of PCT International Application No. PCT/IL2014/050966, International Filing Date Nov. 6, 2014, claiming priority to and benefit of U.S. Provisional Application Ser. No. 61/900,439 filed on Nov. 6, 2013, the contents of which are herein incorporated by reference in their entireties.

TECHNOLOGICAL FIELD

The invention relates to nanotube based electronic devices, their uses and to fabrication techniques of such devices.

BACKGROUND

Carbon nanotubes, and nanotubes in general, form a promising substrate for realizing of ultra-clean and locally-tunable electron systems. Contrary to conventional semiconductors, carbon nanotubes have been shown to naturally grow exceptionally clean, leading to low inherent disorder. Nanotubes also possess a collection of desirable physical properties such as: strong electron-electron interactions which can generate correlated electronic ground states, enable localization and individual control over spins and thus realization of a quantum information chain or charge/spin pumps, and interaction of electronic states with mechanical motion of the nanotubes or other correlated materials.

To date, nanotubes' properties have been exploited mostly in zero-dimensional single and double quantum dot settings. The extension to one-dimensional settings (generally utilizing longer effective regions for interactions) has so far been hindered by disorder, which for longer nanotubes, breaks the electronic system into localized, uncontrolled quantum dots. The currently available conventional technologies for producing ultra-clean nanotube devices generally require growth of pristine nanotubes simultaneously with the fabrication of the associated electrical circuit. These two processes are each highly demanding and thus provide limited success in device production which requires both nanotube growing and appropriate circuit fabrication.

Cleanliness of nanotube is generally achieved by setting the growth of the nanotubes as the last step in device fabrication, this limits many design options of the associated circuit due to the high temperatures required for appropriate growth of the nanotubes. Recently, various stamping approaches have eliminated some of these issues by growing the nanotubes separately from the measurement circuit and transferring them mechanically. However, these approaches remain statistical in nature, resulting in effective yield of few percent even for simple devices utilizing short nanotube. Increasing the device complexity with either longer nanotubes or more complex circuits will decrease the yield further, rendering these approaches less practical. Thus, the potential of the nanotube for creating complex locally-tunable electron systems that are electronically pristine remains unrealized.

GENERAL DESCRIPTION

There is a need in the art for a novel technique enabling assembly of electronic circuits and/or devices utilizing nanotubes as conductive or semi-conductive elements thereof. The present invention provides a technique for producing electronic device utilizing one or more distinct nanotubes while providing high cleanliness of the nanotubes without reducing flexibility of the circuits' design. The technique of the present invention enables accurate control for positioning of one or more single nanotubes in electrical contact with an electrode arrangement, thus providing an electronic device utilizing a selected nanotube having desired electrical and structural parameters. The electronic circuit may generally be a transistor device capable of operating as a field effect transistor, a tunable local barrier detector, a single electron transistor having single, double or multiple quantum dots in series or parallel, utilizing a single nanotube having selected properties as channel elements, or plurality of distinctively selected nanotubes. Additionally the transistor device may be used for a scanning probe microscope enabling detection of electric potential and electric field variations along a surface to be scanned. In this relation, it should be noted that the term nanotube as used herein refers to single- and double-wall carbon nanotubes, as well as other types of nanotubes such as semiconducting nanowires (e.g. Silicon, GaAs etc) and other inorganic nanowires (e.g. Molybdenum disulfide—$MoS_2$).

The technique of the invention is useful for production/assembly of electrical circuits, the technique utilizes one or more nanotubes grown on a first substrate and an appropriate electrical circuit comprising electrode arrangement fabricated on a second substrate. The method comprises bringing the electrode arrangement of the electronic circuit to close proximity with the first substrate to enable direct contact between electrode of the electrode arrangement and a single nanotube located on the first substrate, and detaching said nanotube from the first substrate such that it remains in electrical contact with at least two electrodes of the electrode arrangement.

In order to enable accurate position of a single nanotube, or at least a few separate nanotubes, the first substrate includes long trenches and the nanotubes are grown to extend between trenches of the substrate. Additionally, the nanotubes are preferably grown in low density and substantially parallel to each other while being substantially perpendicular to the direction of the trenches of the substrate.

The electrode arrangement of the electronic circuit preferably comprises at least two electrodes spaced apart from each other and being elevated relative to other electrodes in the circuit, in the assembly process, the at least two elevated electrodes are brought to direct contact with the nanotube on the first substrate, such that in the resulting device the nanotube is suspended between the at least two elevated electrodes. The electrode arrangement may comprise additional electrodes located between the at least two elevated electrodes being lower therefrom. In such configuration, the nanotube is suspended between the elevated electrodes and above additional, lower, electrodes located there between. Thus, generally, the electrode arrangement may be a complex arrangement of electrodes, including electrodes of different heights and positions as well as different (and possibly non-trivial) geometrical shapes.

During the assembly process, the second substrate, carrying the electrode arrangement, is brought to close proximity with the first substrate, carrying one or more nanotubes, such that electrodes of the electrode arrangement are brought into direct contact with a single nanotube. Contact between the electrode arrangement and a nanotube located on the first substrate is detected by electrical measurements, e.g. conductance measurements between the first and second substrates or between two electrodes on the electrodes arrangement. Additionally, when the electrodes are in contact with a nanotube, various electrical measurements may be conducted to provide information about the nanotube in contact. Such electrical measurements provide data about the electrical nature of the nanotube in contact with the electrodes. To this end, the electrical measurements may detect whether the nanotube is metallic or semiconducting, and determine its bandgap if applies. Additionally such measurements may detect contact resistance, electronic disorder along the nanotube, mechanical stability, mechanical resonances and noise level associated with the nanotube and its contact with the electrode arrangement. Based on these electrical measurements a decision can be made if the selected nanotube has suitable properties for the required device, e.g. in terms of cleanliness, electrical properties etc. If the nanotube is found to be sufficient, it is cut to the appropriate length between the elevated electrodes and separated from the first substrate. If the nanotube is found to be inappropriate for use, the electrode arrangement is detached from the nanotube and the system continues looking for additional nanotube along the first substrate.

Additionally, according to some embodiments, the electrode arrangement may comprise electrodes of different lengths near the at least two elevated (source/drain) electrodes, i.e. at sides of the electrode arrangement and/or between the elevated electrodes. The assembly technique may utilize conductance measurements between the nanotube and electrodes of different lengths to provide data indicative of position of the nanotube along the electrode arrangement. Specifically, if a longer electrode is found to be in contact with the nanotube, i.e. certain conductance is measured between the electrode and one of the elevated electrodes the first substrate), whereas a shorter electrode is found to not be in contact with the nanotube, then the position of the nanotube along the electrodes is determined to be between the edge of the short electrode and that of the longer electrode. Thus by placing electrodes of different lengths, at one or more places along the electrode arrangement, the position of the nanotube can be accurately bracketed. It should be noted that according to some embodiments, the use of additional electrodes of different lengths may provide for detection of a relative angle between the electrodes of the electrode arrangement and the selected nanotube. This is by determining at least two positions of contact of the nanotube with electrodes of the electrode arrangement. As the nanotubes' growth provides substantially straight nanotubes, the two points of contact enable determination the position and angle of the selected nanotube. If the nanotube is found not to be in the desired position (e.g. it touches both the short and long electrodes, or it doesn't touch both) then the circuit may be detached from the nanotube, by retracting the second substrate from the first substrate. After detaching, the circuit may be moved parallel to the direction of the electrodes, and the circuit and nanotube are mated again. This process may be repeated until the nanotube is positioned in the desired location and angle on the circuit.

In a specific embodiment elevated metal pillars are placed along the at least two contact electrodes. These pillars act as stoppers to allow an even more accurate positioning of the nanotube in the circuit. The positioning is done by first touching the contacts with the nanotube near the position of the pillars, as described above, and then while in contact sliding the nanotube on top of the contact until it stops at the pillars.

It should be noted that the above described technique may also provide for an electronic device utilizing any number of distinct nanotubes (e.g. one to several tens, hundreds, thousands, or any number of distinct nanotubes), which are distinctly positioned at desired locations along a single electrode arrangement. The nanotubes may be arranges in parallel between the at least two elevated electrodes and/or may be associated with different sets of electrodes to provide two or more transistor structures within a single electronic device. Additionally, the electrode arrangement may include plurality of sets of elevated electrodes arranged parallel to each other, thereby enabling a single nanotube to be attached to plurality of pairs of elevated electrodes. This provides plurality of transistor structures made from the same nanotube thereby having channel of similar characteristics and cleanliness.

Thus, the technique of the present invention enables production of an electronic device comprising one or more transistor structure, such that each transistor structure utilizes one or more distinct nanotubes being a channel element suspended between a source and drain electrode. One or more gate electrodes may be located between the source and drain electrodes, such that the nanotube is suspended above the one or more gate electrodes. The nanotube may be suspended at height between several microns, or as low as several nanometers above the gate electrodes, for example the nanotube may be suspended at height of 50 nanometers above the gate electrodes. Parameters of the nanotube may be selected to provide the transistor structure(s) with desired electrical characteristics.

The assembly technique thus provides the ability to generate electronic devices of high electronic cleanness relative to commercially available solid state-based electronic devices. By appropriately selecting nanotube of desired properties, the resulting device may eliminate or at lease significantly reduce electronic disorder within the device. Additionally, the device may be configured with one or more localized gates located below the suspended nanotube. This allows forming various configurations of transistor structures, including transistor structures localized to a subpart of the suspended nanotube and thus having active elements being far from the contact metals. This eliminates or at least significantly reduces noise and capacitive coupling due to the nearby metals and therefore significantly improves electronic characteristics as compared to conventional devices. Being operated as a transistor structure, the electronic device may be operated as a single electron transistor (SET) and/or as a field effect transistor (FET) in accordance with the surrounding temperature. Moreover, the transistor structure may utilize electrical gating to a localized tunable barrier device along the suspended nanotube. Furthermore, the transistor structure may utilize electrical gating to generate a single electronic quantum dot (QD) along the suspended nanotube, being as short as few tens of nanometers, as well as multiple quantum dots connected in series or in parallel. Additionally the nanotube channel allows high current along the suspended nanotube.

Moreover, localizing the transistor device to a subpart of the nanotube, away from the metallic contacts provide the transistor structure with geometrical lever arm factor, $\alpha$, which is given by the ratio of the capacitance coupling between the device to the gates and the capacitive coupling of the device to the source, drain and gate combined, to be very close to the ideal limit of 1. This allows the transistor structure to be highly sensitive to the surrounding electric fields and allows the use of such device for efficient detection of electric potentials as will be described further below.

The charge noise in the electronic device of the invention may typically be smaller than $1 \cdot 10^{-6} e/\sqrt{Hz}$ where e is the charge of the electron. For 100 nanometer long detecting element this charge noise translates to a voltage sensitivity of about 100 $nV/\sqrt{Hz}$.

Utilizing the ability to select the appropriate nanotube characteristics and directly position it within the transistor structure enables design of an electronic device configured for detection of surrounding electric potentials and electric fields. This provides for a novel scanning probe microscope capable of detection of electric fields and/or electric potential, as well as local capacitance and/or conductance, on microscopic scale, and at time on nano-scale dimensions. The transistor structure may be located on the tip of a scanning probe microscope (SPM) configured to scan along a sample using the nanotube suspended between electrodes of the transistor structure. The application of appropriate bias on selected gate electrodes allows forming a device being appropriately sensitive to the detection of surrounding physical parameters/conditions.

In accordance with surrounding environment, there are several operational scheme of the detector. A first operational scheme utilizes forming of a single localized electrostatic barrier along a subpart of the suspended nanotube. This makes the conductance through the nanotube to be strongly dependent on the height of the localized energy barrier, which in turn is sensitive to the electrostatic potential of the environment. As a result the conductance through such electrostatic barrier forms a sensitive detecting element along the nanotube, and the short length of the barrier allows detection with high spatial resolution. Such detection scheme works at room temperature and provides high spatial resolution and potential sensitivity. According to a second operational scheme, two such electrostatic barriers are formed along the suspended nanotube, confining a quantum dot between them. The conductance through the quantum dot is sensitive to the surrounding electrostatic potentials and thus forms a sensitive detector. This scheme provides similarly high spatial resolution and potential sensitivity. In both cases the barriers may be formed either by gating selected segment(s) of the nanotube such that their chemical potential is inside the bandgap of the nanotube, or by electrostatically gating adjacent sections of the suspended nanotube to be populated by electrons (n-type) and holes (p-type). This forms p-n junction(s) at the selected region(s) along the nanotube which acts as the appropriate barriers for conductance. Selection of appropriate gate(s) and appropriate bias thereon enables determining size and position of energy barriers and/or p-n junction(s) along the nanotube and in-situ variation thereof. Thus a single tunable barrier, single- double- or multiple-QD may be formed along a single suspended nanotube segment, in accordance with the number and arrangement of the gate electrodes, and its position and properties along the suspended nanotube can be precisely tuned using the voltages on these gates.

Current flow through the above described QD or tunable local barrier is thus highly sensitive to charge induced thereon by any element in the surrounding, being a factor of the electrostatic potential difference and capacitance between the detecting element in the nanotube (QD or tunable barrier) and elements in the surrounding that induce electric charge. Such elements can be metallic conductors (e.g. the contacts and gate of a device under study) or fixed charge in a semiconductor or an insulator (e.g. individual dopant atoms buried under the surface in the sample under study). In both cases any potential induced by these elements on the nanotube can be quantitatively determined using the measured conductance through the nanotube. This provides the transistor structure to be highly sensitive to electrical properties of its environments allowing the scanning microscope to sense variation in electric fields/potentials of its surroundings.

More specifically, while scanning a sample using a probe carrying the transistor structure of the invention, the SPM system may apply AC voltage at selected frequency on one or more electrodes of the transistor structure, as well as on appropriate contacts associated with the sample under study. It should be noted that preferably, the SPM system applies simultaneously AC signals of different frequencies and/or amplitudes to different electrical contacts or electrodes. For example, if the sample under study is a simple transistor structure, independent AC voltages can be applied on its source, drain, and gate. The AC signals on the local gates of the scanning transistor as well as on the contacts of the sample under study create corresponding AC components in the source drain current through the nanotube. By measuring these independent AC current components for given AC voltage excitations, the independent capacitances between each of the contacts/gates and the nanotube detector can be directly determined. Once the capacitances are known, potential variations on any of the contacts and gates on the sample under study can be directly determined from the measured current.

Additionally, variations of electric potential on the sample as a function of position would also translate into corresponding modulation in current in the transistor while scanning along the surface the sample, thereby enabling to map the local potential landscape within the sample. Due to the use of an extremely clean, isolated nanotube, and due to the localization of the detection element onto a small section of the nanotube, the system is capable to resolve a tiny fraction of a single electron charge, i.e. a charge variation of the order of $\delta Q \sim 1 \cdot 10^{-6} e/\sqrt{Hz}$. The small size of the nanotube and the ability to use the one or more gates to electrostatically form QD's along the suspended nanotube provides the scanning probe microscope with high spatial resolution, e.g. of nanometer scale. The ability to deterministically select the appropriate nanotube having high electronic quality (i.e. high cleanliness and low disorder), which is built into the assembly method, allows to form detectors capable of efficiently operating at high frequencies, e.g. up to hundreds of GHz's. This enables the scanning probe microscope system of the present invention to provide accurate, high frequency and extremely sensitive electric potential detection, with high resolution for any sample under study.

Thus, according to one broad aspect of the invention, there is provided a method for use in construction of an electronic device. The method comprises: providing one or more nanotubes grown on a surface of a first substrate; providing a desired electrode arrangement fabricated on a surface of a second substrate and comprising at least two elevated source and drain electrodes and one or more gate electrodes located in between the elevated source and drain electrodes; bringing the electrode arrangement on the second substrate to close proximity with the first substrate such that surfaces of the first and second substrates face each other; scanning said first substrate with said electrode arrangement and determining contact of electrodes of the electrode arrangement with a nanotube located on the first substrate; detaching said nanotube from the first substrate to provide a transistor structure comprising an isolated nanotube between the source and drain electrodes.

The desired electrode arrangement may be fabricated on a tip-like structure of the second substrate to thereby allow scanning the tip carrying the electrode arrangement along a surface of any generic substrate.

The determination of the contact between the electrodes and a nanotube located on the first substrate may comprise electrical measurement between the first and second substrate. These may for example be resistance measurements between specific electrodes of the electrode arrangement and the first substrate and/or resistance measurement between two electrodes located on a cantilever being in electrical contact with the nanotubes.

The first substrate may comprise at least two adjacent trenches. At least one nanotube may be grown on the first substrate across at least one trench.

The desired electrode arrangement may comprise two or more external elevated electrodes. The nanotube may be detached from the first substrate by transmitting appropriate electrical current between one of the external electrodes and a corresponding one of the source or drain electrodes to thereby cut the nanotube to be confined between the elevated source and drain electrodes. More generically, the electrode arrangement may comprise a set of elevated electrodes that allow cutting the nanotube between any pair of neighboring electrode.

The method of the invention can be used for determining various properties of the nanotubes, including electrical and mechanical properties. For example, the electrical properties of the nanotube being in contact with the electrode arrangement may be determined, and upon identifying them insufficient, the electrode arrangement may be detached from the nanotube. After detaching the electrode arrangement from the nanotube having insufficient electrical properties, the first substrate may be scanned for additional nanotubes.

The determination of the contact of electrodes with a nanotube, while at the close proximity of the first and second substrates may be performed at low temperatures.

The electrode arrangement may comprise a plurality of the contact electrodes of different lengths. The scanning of the first substrate with the electrode arrangement may include touching a selected nanotube on the first substrate and determining a longitudinal location of the nanotube along the electrode arrangement. During the scanning, the longitudinal location of the nanotubes may be determined to identify whether it is desired, and if needed the nanotube may be detached to provide contact on a different longitudinal location. Alternatively, or additionally, an angular orientation of a nanotube may be determined while the nanotube is in contact with the electrode arrangement. This is done in accordance with electrical contact with the plurality of electrodes of different lengths.

The second substrate may comprise a plurality of parallel electrode arrangements, enabling attaching of a single nanotube to the plurality of electrode arrangement.

The method may further include annealing of the contact of the nanotube and electrodes by applying electric current between the selected electrodes.

Further, the electrode arrangement may be appropriately cleaned, e.g. utilizing plasma etching, e.g. on the first substrate, thereby providing desirably conducting electric contacts on the electrode arrangement. Generally, plasma etching is done by ion spattering that physically removes the contaminants on top of metals. In some embodiments of the invention, Ar ions are used, but the invention is not limited to this example and other ions can be used as well. The plasma cleaning can be done just before introducing the sample to the vacuum chamber of the SPM; or the plasma treatment may be performed in situ. In the latter case, the second substrate is inserted into the vacuum chamber, cleaned by Ar plasma, and then, without breaking vacuum, the substrate is transferred into the SPM for mating.

According to another broad aspect of the invention, there is provided a transistor structure comprising an electrode arrangement comprising the at least two elevated electrodes comprising at least a source and a drain electrodes, and one or more gate electrodes located between said source and drain electrodes, and one or more distinct nanotubes bridging between at least two elevated electrodes of said electrode arrangement; the transistor device being characterized in that the one or more distinct nanotubes being suspended between the source and drain electrodes above the one or more gate electrodes.

The transistor structure may be configured for operating as a single electron transistor. For example, the transistor structure may be configured to generate a Quantum dot along the nanotube being electrostatically defined on part of the suspended nanotubes; or to generate two or more quantum dots along the suspended nanotube, each being electrostatically defined on a respective part of the nanotubes.

The transistor structure may be configured for use as a tunable localized barrier, e.g. being localized along a part of the suspended nanotube.

The transistor structure may be configured to electrostatically define, using appropriate voltages on gates, active elements along the nanotubes(s) comprising source, drain and channel and being localized along at least one nanotubes. The configuration may be such that a lever arm factor $\alpha$ of the structure is substantially unity.

The electrode arrangement may be mounted on a cantilever like tip, and at least one of the distinct nanotubes may be located at an end portion of the cantilever like tip.

According to yet another broad aspect of the invention, there is provided an electronic device comprising two or more transistor structures (e.g. a one dimensional or a two-dimensional array of transistor structures), said two or more transistor structure comprising a transistor structure having at least one nanotube suspended between at least two corresponding elevated electrodes, the electronic device being characterized in that each of said two or more transistor structures comprises a suspended nanotube being cut between regions associated with separate transistor structures.

In yet further aspect of the invention, it provides a system configured for scanning the surface of a sample, the system comprising: a cantilever like tip carrying a scanning probe and a scanning unit comprising moving elements and configured to enable movement of the cantilever like tip along at least three perpendicular axes; wherein said scanning probe comprises an electrode arrangement comprising source and drain electrodes and at least one gate electrode located between the source and drain electrodes, and at least one distinct nanotube extending between the source and drain electrodes and being suspended above said at least one gate electrodes, such that a current through said at least one distinct nanotube being indicative of electrical properties of its surroundings.

It should be noted that the method of the invention provides for measuring various properties/parameters nanotubes as exemplified above, as well as allows for appropriately tuning one or more of these parameters. This may for example be implemented by tensioning the nanotubes. More specifically, during the mating process, after contacting the nanotube with the elevated contacts in both sides (before the cutting) pushing of the circuit further (deeper) into the trench may continue. This pushes the nanotube, elongates it and tensions it. If the nanotube is free to slide over the contacts, then the section between the contacts gets the same tension as the sections connected to the first substrate. Using this approach, the nanotube can be controllably tensioned to a desired build in tension, until its breaking limit. It is important to note that this provides for changing the properties of a nanotube by tension. With the tension, a semiconducting nanotube can be turned into a metallic one and vice versa, as well as an intermediate effect can be achieved, namely appropriate adjustment of the bandgap. The tension also allows for modifying the mechanical resonance frequencies of the nanotube over a wide range (from few MHz to few GHz). This is important for example when the nanotube is to be used as a mechanical resonator, or for controlling the effect of the mechanical degrees of freedom on the electronic degrees of freedom. It should be noted that for the tensioning to be effective, the nanotube should preferably be clamped at the lips of the trench. This may require selective evaporation of metal on the first substrate, such that the metal covers the nanotubes on the plateaus between trenches and does not contaminate the suspended parts in the trenches. This is done cleanly by evaporating the metal through a stencil mask, thus avoiding any chemical processing or lithography that will contaminate the nanotubes.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 3A shows nanotubes grown on a first substrate, FIG. 3B illustrates an appropriate electrode arrangement on a second substrate. FIG. 3C illustrates a scanning probe microscope carrying the first and second substrates, and FIG. 3D exemplifies how contact between the electrodes and a nanotube is provided;

FIG. 5A shows a SEM image of a tip carrying the transistor structure, and FIG. 5B illustrate the probe located above a substrate to be inspected;

DETAILED DESCRIPTION OF EMBODIMENTS

Figure 1:
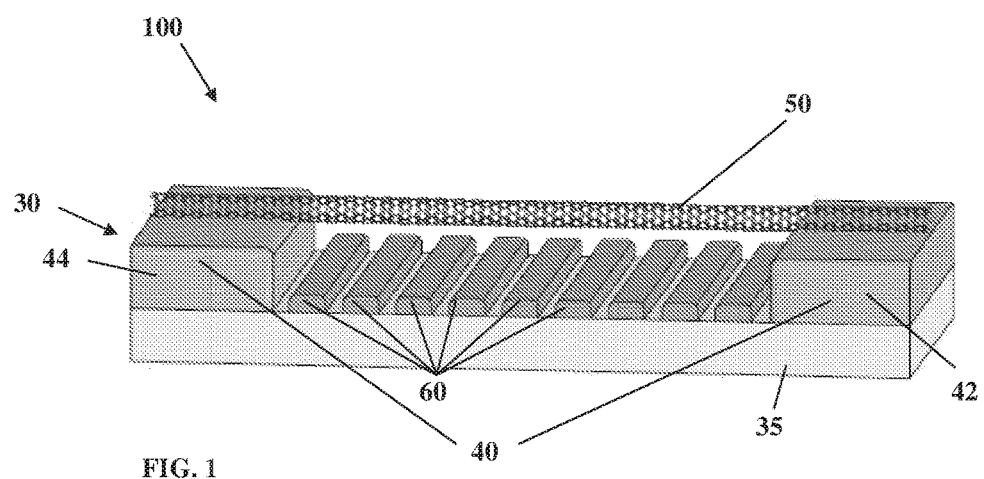
FIG. 1 schematically exemplifies a transistor structure fabricated in accordance with the technique of the present invention.

The technique of the present invention provides a realization of a nano-assembly technique allowing us to deterministically deposit nanotubes onto an electrode arrangement accurately at desired locations. The technique enables selection of the deposited nanotube to thus provide clean, highly ordered (ultra-low disorder), suspended, nanotube devices with electrical circuits of selected arbitrary complexity. This enables production of a single nanotube (or multiple distinct nanotubes) based transistor structure providing high control over source-drain current as well as over charge localization along the channel. Additionally such transistor structure may be used to provide a novel and highly sensitive detection system for detecting electric potentials, e.g. measurements of materials' surfaces on microscopic scale. The ability to localize the electrons using electric fields applied by one or more gates allows for creation of clean and controllable conduction barriers along the nanotube, thereby yielding the device with near ideal electronic characteristics.

The technique provides an ability to create an electronic device capable of operating such that only a part/segment of the suspended nanotube acts as the active element. This may be provided by creating one or more barriers at certain distance into the suspended part of the nanotube and away from the metallic contacts. In such geometry, the actual source and drain contacts to the active element are associated with the two suspended nanotube sections that connect between the metallic contacts and the barrier(s). This barrier geometry provides for minimizing the capacitance between the active region of the nanotube and the source and drain leads, such that most of the capacitance of the active element is associated with its capacitance to a corresponding local gate or to the sample under study. When acting as a local potential detector the efficiency of this detector is generally reduced by the lever arm factor: $\alpha=C_g/(C_g+C_s+C_d)$ where $C_g$ is the capacitance to the corresponding local gate or the sample under study acting as a gate, and $C_s$, $C_d$ are the capacitances to the source and drain regions. Measurements of electric potentials and fields with high spatial resolution require detection of basic features which are small in size. As a result the capacitance between the small features on the sample and the detector, $C_g$, is necessarily small. For example, for nanometer-sized features this capacitance is typically around an atto-Farad ($10^{-18}$ Farad) or below. Since in the conventional devices the capacitances between the active region and the source and drain, $C_s$ and $C_d$, are orders of magnitudes larger than this gate capacitance, their efficiency, if used as detectors, is severely reduced by the lever arm factor. However, the electronic device of the present invention, using gates to localize the active part to a small section of the nanotube, allows to reach the ideal geometries with ideal lever arm factor ($\alpha=1$) which allow to achieve ideal efficiency of the detector, and detection sensitivity orders of magnitude than is presently achievable.

Reference is made to FIG. 1 illustrating a schematic example of a transistor structure 100 fabricated in accordance with the technique of the present invention. The transistor structure 100 includes an electrode arrangement 30 being formed by plurality of electrodes deposited on a substrate 35, the plurality of electrodes include at least two elevated electrodes 40, two such elevated electrodes 42 and 44 are shown here, which are generally located on both sides of the device, and one or more additional electrodes 60 located between the two or more elevated electrodes 40. Utilizing the technique described below, a single, distinct, nanotube 50 is located on the electrode arrangement 30, such that the nanotube 50 is in electrical contact with two elevated electrodes 42 and 44, while being suspended above the additional electrodes 60. The use of the technique of the present invention provides that the nanotube 35 stretches between the elevated electrodes 42 and 44, being effectively source and drain contacts to the transistor structure, while floating a few nanometers but having no physical or electrical contact with the additional electrodes 60, which are effectively gate electrodes. One or more active segments of the channel are formed by appropriate gating along the entire suspended nanotube (using one or more gates). The remaining segments of the suspended nanotube leading to the active part act as the source and drain electrodes.

Such positioning and deposition of nanotubes onto the electrode arrangement enable direct and accurate positioning of one or more distinct nanotubes 50 providing direct electrical contact with two or more electrodes 40 while extending a distance of few nanometers or more above other electrodes 60 of the electrode arrangement 30. Additionally, this enables appropriate selection of nanotubes characteristics and cleanliness to controllably provide desired properties of the transistor structure.

Figure 2:
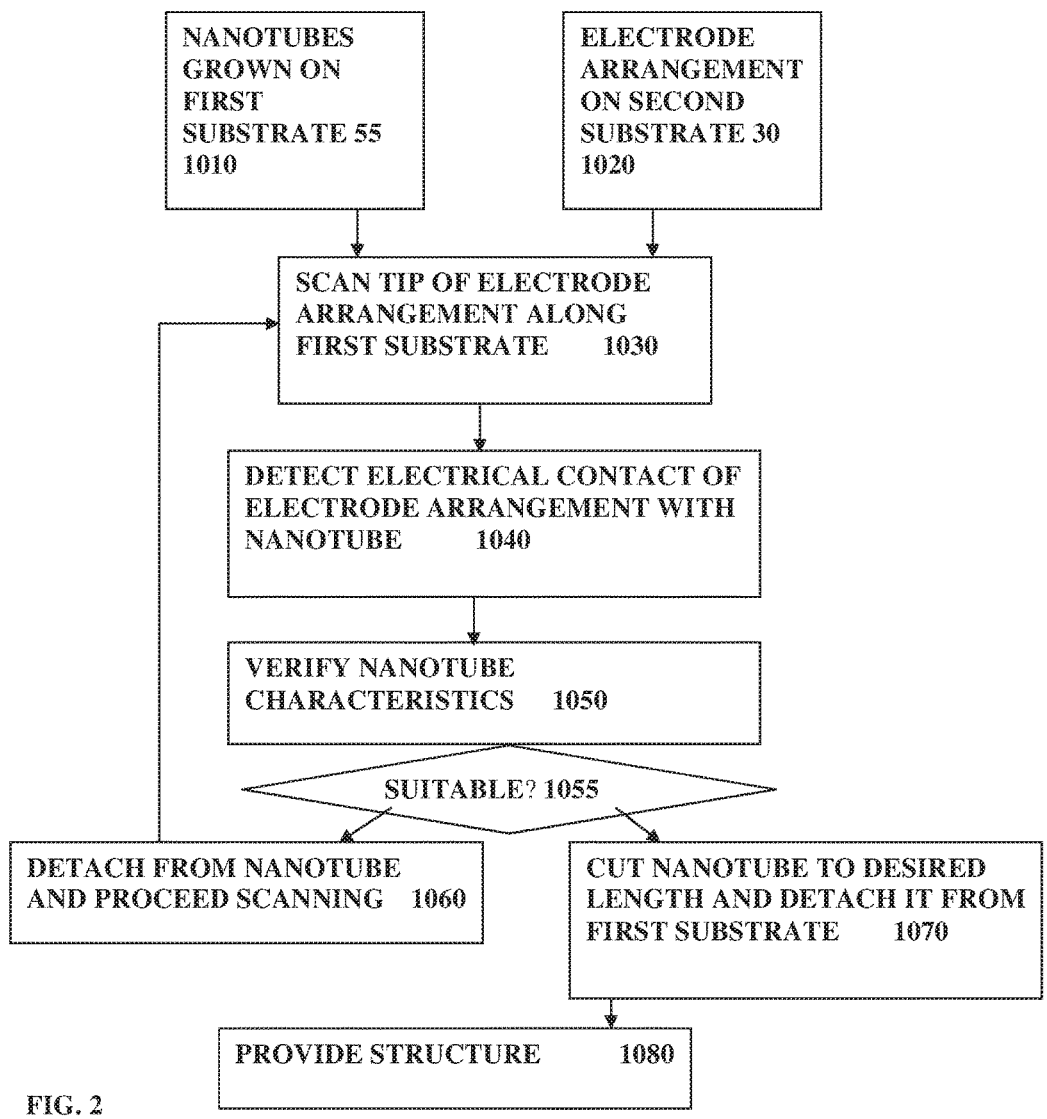
FIG. 2 illustrates the assembly technique of the present invention in a way of a block diagram.

The technique of the present invention utilizes a scanning probe microscope manipulation to achieve deterministic assembly of the transistor structure. Reference is made to FIG. 2 illustrating the technique in a way of a block diagram. As shown, long, parallel nanotubes are grown on a first substrate/chip (1010). The nanotubes 55 are preferably grown to be suspended without slack over wide trenches as will be described below. Additionally, an electrical circuit including an electrode arrangement 30 is provided (1020), fabricated on a separated (second) substrate. The electrode arrangement generally includes an array of parallel electrodes, where the external electrodes are taller than the rest as shown in FIG. 1, i.e. extend to be higher relative to surface of the circuit. It should be noted that the electrode arrangement may be fabricated using any well-known fabrication techniques. The electrical circuit is preferably fabricated on a narrow cantilever, tip-like element formed in the second substrate/chip. Thus, the nanotubes and electrode arrangement are fabricated in two independent processes and do not impose any restrictions one on the other.

Figure 3A:
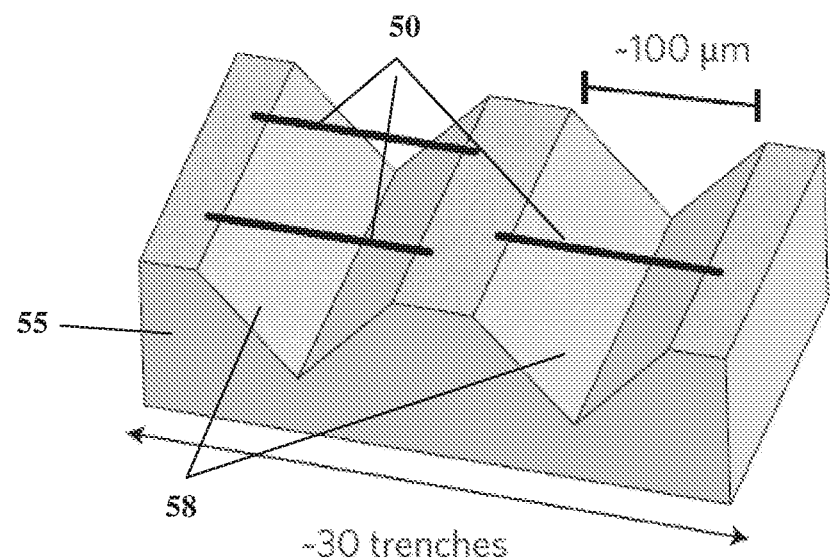
FIGS. 3A-3D exemplify the assembly technique of the invention.
Figure 3B:
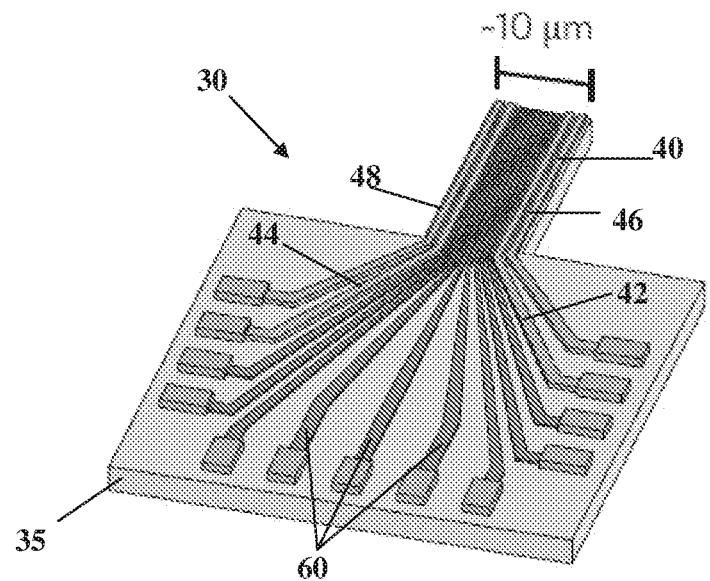
Figure 3C:
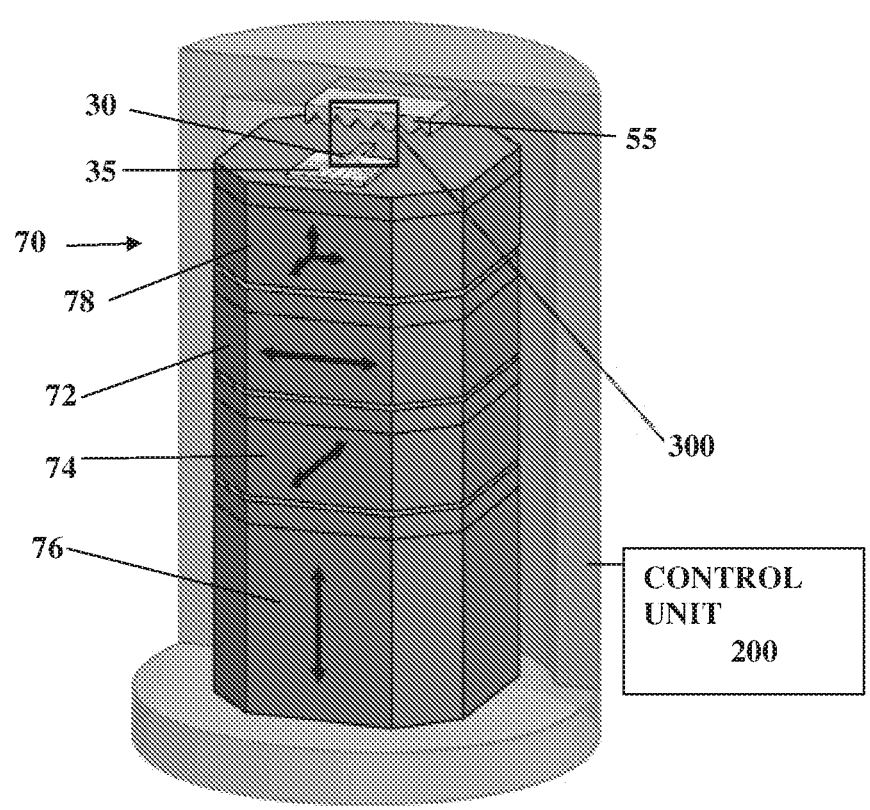
Figure 3D:
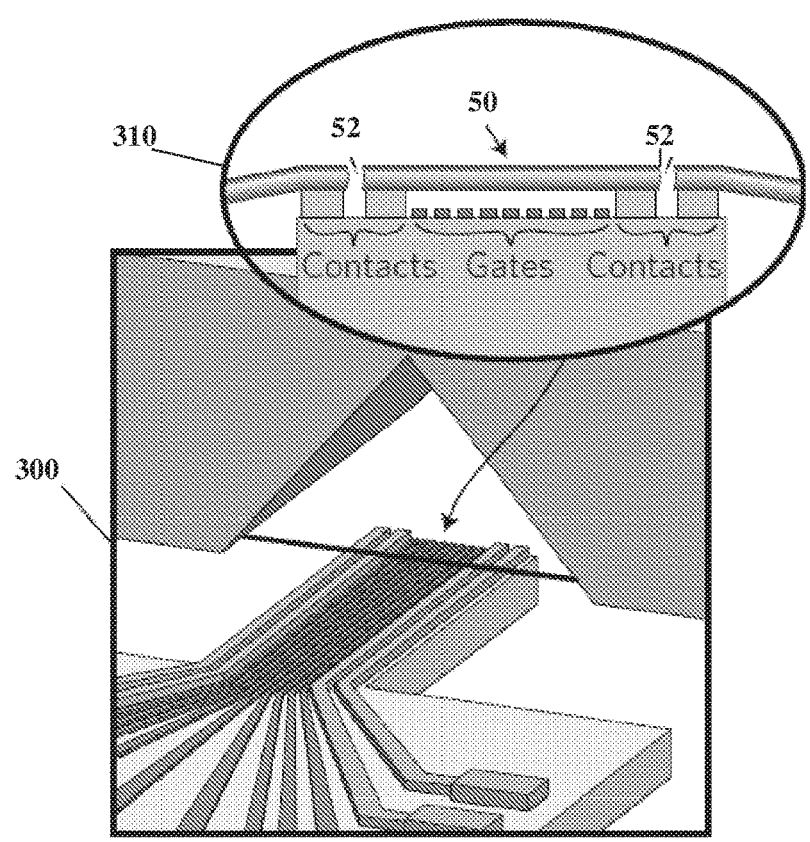

The electrode arrangement and the nanotubes on the first substrate are placed in a scanning probe microscope, facing one another, to allow scanning of the first substrate with the cantilever carrying the electrode arrangement to located suitable nanotubes (1030). The relative alignment of the two chips along 6 degrees of freedom (i.e. positions and angles) is accurately determined by a sequence of capacitance measurements between specially designated capacitance pads on the circuit chip and the nanotube chip. Alternatively or additionally, this relative alignment can be determined by optical measurements. The electrode arrangement is brought to close proximity with the first substrate carrying the nanotubes and the cantilever is carefully inserted into one of the trenches. Due to the height difference between the electrodes of the electrode arrangement, the elevated electrodes are closer to the nanotubes and thus form contact thereto. Such contact can be detected by electrical measurements such as resistance measurement between the first and second substrates (1040) and/or by resistance measurements between two electrodes on the cantilever, being in electrical connection through a nanotube, in case it touches both electrodes. Once such contact is detected, the additional electrical measurements can be made to verify characteristics of the nanotube in contact (1050). At this time a decision is made whether the detected nanotube is sufficient or not (1055), and according to some embodiments whether it is positioned at the desired placed along the electrode arrangement. If any of the nanotube's characteristics is found to be insufficient for the process or the nanotube is not positioned within the desired region of the electrode arrangement, the cantilever is lowered (to a larger distance from the first substrate) to detach the electrodes from the nanotube (1060). The cantilever may then be transferred to another trench for coupling with one other nanotube. Alternatively, if the characteristics of the nanotube are found to be sufficient, the nanotube is cut to fit between the elevated electrodes utilizing electric current (1070) and the electronic device may be ready (1080) and may be removed from the scanning probe microscope system. According to some embodiments, the assembly technique includes an annealing process which may be performed before and/or after cutting of the selected nanotube. The annealing provides for improved electrical and mechanical quality of the contacts as well as the physical cleanliness of the suspended nanotube. The annealing may be performed by passing an intermediate current, either between one of the elevated electrodes and an additional electrode located in same side of the electrode arrangement, or between the two elevated electrodes which may later operate as source and drain electrodes. It should be noted that the annealing current should be lower than the electrical current required for cutting of the nanotube. Reference is now made to FIGS. 3A-3D exemplifying the technique in more details. FIG. 3A shows nanotubes 50 grown on a first substrate 55, FIG. 39 illustrates an electrode arrangement 30 on a second substrate 35, FIG. 3C illustrates the first 55 and second 35 substrates being placed in a scanning probe microscope 70 (SPM), and FIG. 3D shows contact between the electrodes and a nanotube within the SPM 70.

More specifically, as shown in FIG. 3A, the first substrate 55 is preferably configured with wide trenches 58. The nanotubes 50 may be grown to extend between trenches to thereby allow the electrode arrangement to reach the central region of a selected nanotube by scanning along a trench 58. For example, the first substrate 55 is etched (e.g. in KOH solution) to form deep, wide trenches with wall angle of about 50°. Additionally the first substrate may undergo a second etch (e.g. in TMAH solution) to form a shallow trench lip with slope angle of about 23°. This shallow lip allows nanotubes to easily stick to the surface after growth and thus to eliminates slack of nanotubes. The first substrate may be metalized (e.g. with Ti/Pt) to provide sufficient electrical contacts between the first substrate and nanotubes located thereon. This allows contact detection between nanotube and the electrode arrangement by resistance measurement between first and the second substrates to determine contact between the electrode arrangement and a nanotube on the first substrate. The metallization also allows the use of capacitive measurements to determine relative alignment between first and second substrates.

The nanotubes 50 may be grown on the first substrate from catalysts deposited on plateaus between trenches using lithographically-defined pads. The nanotubes' growth may be performed with Chemical Vapor Deposition (CVD) using a standard growth recipe for single-walled carbon nanotubes as known in the art. Generally, such CVD technique utilizes argon, hydrogen, and ethylene and/or methane gases. In order to provide the nanotubes growth to be aligned, perpendicular to the trenches as shown in the figure, a high gas flow may be maintained, flowing above the surface of the first substrate perpendicular to direction of the trenches, during growth of the nanotube. This gas flow causes alignment of the grown nanotubes along its direction. Typically, this enables parallel growth of suspended nanotubes, being perpendicular to the trenches, with angle tolerance of ±10', or at time of ±6', and in some preferred embodiments with angle tolerance of ±3'.

In a separate process, the electrode arrangement 30 is fabricated on a second substrate 35. FIG. 3B shows an example of electrode arrangement 30 configured for generation of a multi-gate transistor structure. The electrode arrangement 30 includes external elevated electrodes 40 and central, internal lower electrodes 60. In this specific example, the electrode arrangement includes four elevated electrodes selected such that two of the electrodes 42 and 44 are central with respect to two other electrodes 46 and 48. The central electrodes 42 and 44 have electrical connection to operate as source and drain electrodes of the complete product while the external electrodes 46 and 48 are provided to assist in cutting of the nanotube during the production process. Additional one or more electrodes 60 are located between the elevated electrodes 40 and configured to be lower than the elevated electrodes, the height difference may be between a few nanometers to a few micrometers.

FIGS. 3C and 3D illustrate the assembly of the electronic device. FIG. 3C shows a scanning probe microscope 70 (SPM) connectable to a suitable control unit 200 for assembly of the electronic device; and FIG. 3D shows the assembly region 300 in more details, as well as close look on the cut nanotube 310. The first substrate 55, carrying the nanotubes, is placed within the range of the scanning probe microscope 70. The second substrate 35 of the electrode arrangement 30 is placed on the other side of the SPM 70 facing the first substrate 55. The SPM 70 is configured to scan the second substrate 35 along trenches of the first substrate 55 in order to connect the electrode arrangement 30 with a nanotube 50 located on the first substrate 55. Generally, the SPM 70 may be connected to a control unit 200 which is configured and operable to operate the SPM 70 to scan along the tranches of the first substrate 55 and to detect if the electrodes of the electrode arrangement 30 are in contact with any of the nanotubes on the first substrate 55.

The SPM 70 typically includes one or more piezoelectric actuators configured to vary location of the probe in accordance with electrical signals applied thereto. Four such actuators are shown in FIG. 3C, actuators 72, 74 and 76 are configured to move the probe along three perpendicular axes with accuracy of about ±1 μm, and actuator 78 is configured to enable scanning with nanometric accuracy. The control unit 200 is connectable to the piezoelectric actuators 72, 74, 76 and 78 and may also be connectable to at least some of the electrodes of the electrode arrangement 30 and to the first substrate 55. This connection enable the control unit to detect electrical connection of one or more electrodes of the electrode arrangement 30 to a nanotube on the first substrate 55, and according to some embodiments to measure characteristics of the nanotube before removing it from the first substrate 55.

Generally the control unit 200 is configured to provide appropriate electric signals to the actuators 72, 74, 76 and 78, to perform electric measurements between the electrodes of the electrode arrangement 30 between them and between them and between the first substrate 55, and to provide appropriate electric signal to electrodes of the electrode arrangement 30 as described below. These measurements enable the control unit 200 to scan the probe through several trenches, and to connect and detach the electrode arrangement 30 from different nanotubes, while avoiding crashing or contaminating the cantilever.

In order to find a suitable nanotube, the control unit may operate the SPM actuators to scan the probe carrying the electrode arrangement 30 along trenches of the first substrate 55 and measure resistance between them. The control unit 200 may utilize variations in capacitance between the electrode arrangement 30 and the first substrate 55 to navigate along the substrate between trenches and resistance measurements to identify contact to nanotubes on the substrate. A drop in resistance may indicate contact of the probe to a nanotube located on the first substrate 55. At this point the control unit 200 may operate actuator 78 to provide fine tuning of the probe location. Direct contact between a nanotube and any one of the electrodes in the electrode arrangement 30 is identified by resistance measurement between the specific electrodes of the electrode arrangement and the first substrate 55. When such contact is determined, the Control unit 200 may operate actuator 78 to vary the distance between the probe and the first substrate 55 (lower the probe). In some embodiments, the distance between the first and second substrates is varied such that only the elevated electrodes are in electrical contact with the selected nanotube, according to some other embodiments, any desired number of electrodes is brought to contact with the nanotube. Thus the distance between the probe and the first substrate 55 may be such that the nanotube is in physical contact with some or all of the electrodes of the electrode arrangement, and not necessarily only the elevated electrodes. If any unwanted contact between the nanotube and certain electrodes of the electrode arrangement (e.g. the gate electrodes) is detected by electrical measurements (e.g. resistance), the nanotube is detached from the electrode arrangement and contacted again. When sufficient contact between the nanotube and the appropriate electrodes is detected by resistance measurements, additional in-situ gate-dependent transport measurements can be performed to verify quality of the nanotube. Such in-situ measurements may include probing conductance of the nanotube as a function of bias between the source and drain contacts and as a function of voltage on each of the individual gates. Other measurements may involve high frequency voltages applied on the gates and/or the contacts to actuate and detect mechanical vibrations of the suspended nanotube. Additional measurements may be performed to determine appropriate physical characteristics of the selected nanotube. According to some embodiments of the invention, the electrode arrangement may be configured with electrical contacts of varying lengths or a wrap-around geometry (as shown in e.g. FIG. 4D). Such electrodes' configuration allows utilizing resistance measurements between different contacts and a selected nanotube to determine position of the nanotube along the electrode arrangement 30. If the nanotube is found to be positioned at an undesired location along the electrode arrangement, the SPM detaches the electrode arrangement 30 from the nanotube and touches it again after moving its position. Utilizing an appropriately configured electrode arrangement and possibly repeating this procedure, the technique of the invention allows for positioning a selected nanotube at a desired location with accuracy of tens of nanometers.

After the nanotube is properly characterized, the control unit operates to compare the measurements' results with desired specs of the electronic device and to decide whether the selected nanotube is appropriate for the device or not. If the nanotube is found to be inappropriate for the specific design of the electronic device, in terms of molecular or electronic disorder, high doping rate, inappropriate bandgap, bad contact resistance, etc., the control unit may operate to move the electrode arrangement away from the first substrate to thereby detach the nanotube from the electrodes, leaving the electrode arrangement and the nanotube undamaged. If the nanotube's characteristics are found to be appropriate, the control unit operates to appropriately cut the nanotube to a desired length to be in electrical contact with selected elevated electrodes as shown in FIG. 3D and more specifically in the enlarged inset 310. To this end, the control unit 200 passes high electrical current between adjacent pairs of electrodes enabling surgical cut 52 of the nanotube 50 at desired, well-defined, locations and separation of the nanotube 50 from the first substrate 55 without damaging the segment of the nanotubes within the electrode arrangement 30.

It should be noted that once a nanotube is attached to the electrode arrangement, the process may continue for attaching an additional distinct nanotube in electrical contact with different electrodes of the electrode arrangement in accordance with the design of the electronic device and the architecture of the electrode arrangement. In this connection reference is made to FIGS. 4A-4D showing Scanning Electron Microscope (SEM) images of the first substrate carrying nanotube grown between trenches (FIG. 4A), electrode arrangement carried on a tip of a scanning probe microscope (FIG. 4B) and two configurations of the transistor structure having respectively one and two nanotubes positioned between corresponding electrodes (FIGS. 4C and 4D).

Figure 4A:
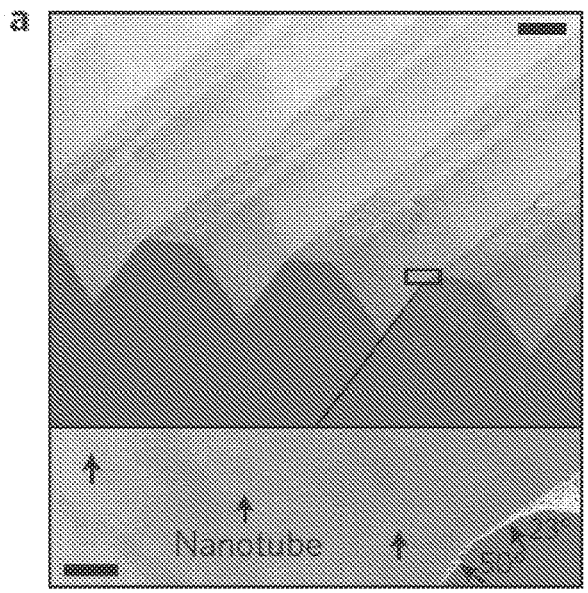
FIGS. 4A-4D show Scanning Electron Microscope (SEM) images of the first substrate carrying nanotube (FIG. 4A), electrode arrangement carried on a tip of a scanning probe microscope (FIG. 4B) and two configurations of the transistor structure having respectively one and two nanotubes (FIGS. 4C and 4D)
Figure 4B:
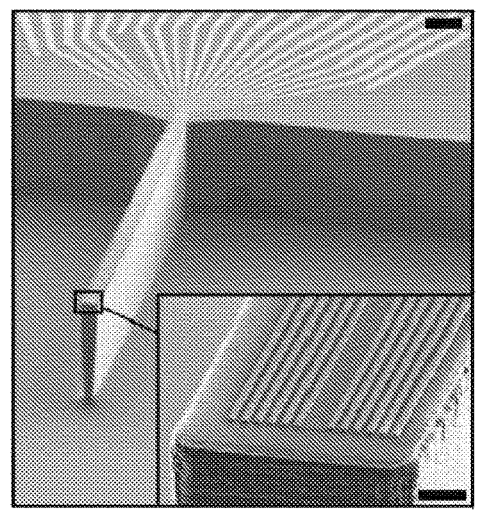
Figure 4C:
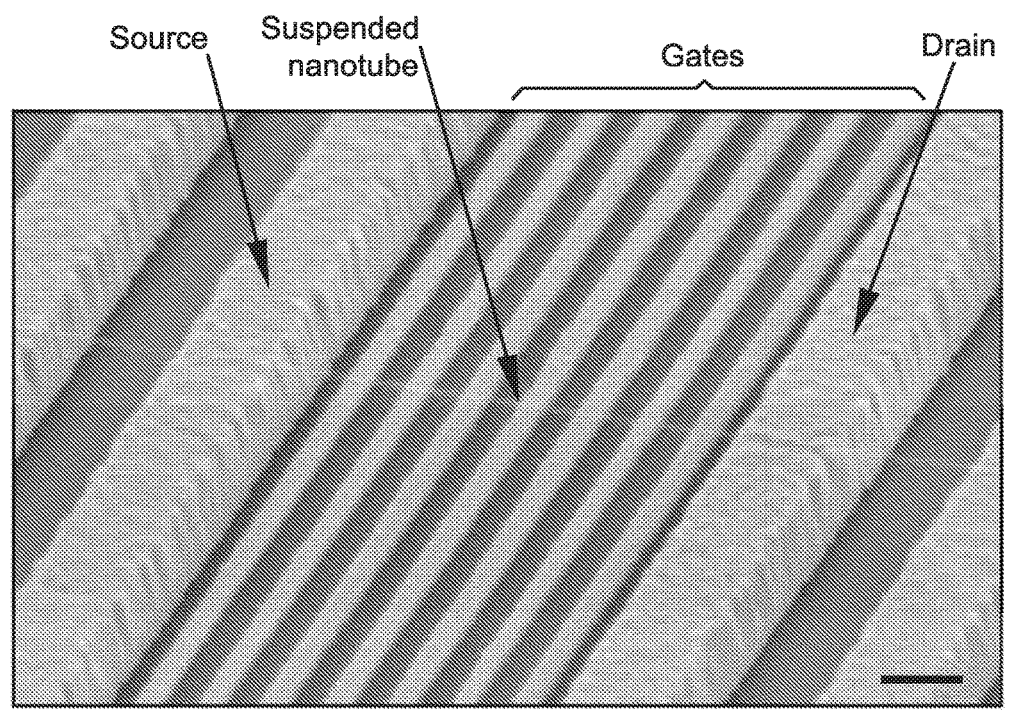
Figure 4D:
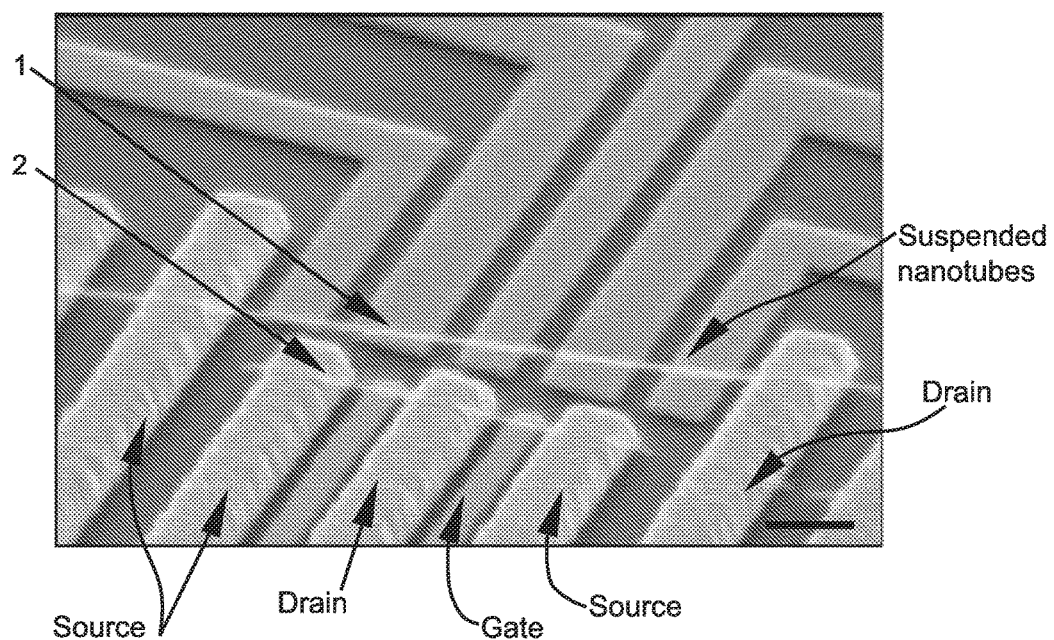

As shown in FIG. 4A, the first substrate includes plurality of parallel trenches, inset in the figure illustrate a single nanotube grown within the trench being perpendicular to the direction of the trenches. FIG. 4B shows a probe, configured for use in a scanning probe microscope, carrying an electrode arrangement and a close-up look at the electrode arrangement. The probe carrying the electrode arrangement is brought to close proximity with the first substrate within the scanning probe microscope, and is directed along trenches of the first substrate in order to mate the electrode arrangement with an appropriate nanotube. As indicated above, resistance measurements enable detection of nanotube located above the electrode arrangement, and additional measurements are used to detect quality of the nanotube before cutting the nanotube and detaching it from the first substrate. FIG. 4C shows the electrode arrangement mated with a nanotube suspended between the elevated electrode and over the additional (gate) electrodes. Generally the nanotube is cut to extend between two elevated electrodes (e.g. source and drain electrodes). In FIG. 4C the nanotube is positioned in electrical contact with two elevated electrodes at each side thereof, thus enabling complex electrical functionality of the resulting electronic device (e.g. four probe conductance measurements). The cutting of the nanotube at a desired location is generally performed by providing a high current between electrodes adjacent to the location of the desired cut. The electrical current causes the nanotube to heat and cut at the desired location. FIG. 4D shows an electrode arrangement including plurality of elevated electrodes forming together two transistor structures such that each transistor structure utilizes a distinct nanotube as channel element, suspended nanotubes 1 and 2 are shown in the figure. As shown, a single nanotube may be attached to an electrode arrangement to thereby provide plurality of transistor structures (two transistors are formed from nanotube 2 shown in FIG. 4D, utilizing a single drain electrode and two source electrodes on each side thereof) by positioning the nanotube in contact with array of electrodes/contacts, with one or more local gates there between. Thus the technique allows for assembling a plurality of transistor devices utilizing a single nanotube, thereby forming an array of devices/detectors having similar properties (formed from the same nanotube), and thus are easier to control with fewer control gates. As indicated above, the different nanotubes may generally be deposited onto the electrode arrangement one by one, to enable determining the quality of each one of them individually and to deposit each one of them at the desired location.

The above described technique provides for producing various types of electronic devices having a multi-gated, suspended, nanotube geometry. The resulting transistor structures may be configured with desirably tailored electrical performance. The use of one or more independent gate electrodes provides control over number and location of barrier regions along the suspended nanotube thus enabling variation of the channel length and accurate occupation of charge carriers therealong. Such control over the channel length may provide in-situ variations/adjustments (i.e. during transistor operation) by varying the voltages applied on the different gates and thus utilizing various lengths of the suspended nanotube as channel.

The transistor structure may be operated as a tunable local barrier, or as a Single Electron Transistor (SET), in accordance with operation scheme and conditions. In its operation as a tunable local barrier, one or more gate electrodes provide bias voltage to dope a desired local section of the nanotube and shift the chemical potential therein into the bandgap. As a result a local barrier for transport is formed, whose properties dominate the conductance through the nanotube. The strong dependence of the local barrier height on adjacent gate voltages makes the local tunable barrier a sensitive detector for local potential changes. In its operation as SET, two or more local barriers are formed along the nanotube to confine a quantum dot between them. In one embodiment each of these two barriers is formed by biasing one or more gates to tune the local chemical potential in the nanotube sections directly above such one or more gates into the nanotube bandgap. In alternative embodiment one or more gate electrodes provide bias voltage thereby doping desired sections of the nanotubes with electrons and hole, forming p-n junctions at the transitions between these regions. These p-n junctions act as barriers for electronic conductance thereby isolating one or more quantum dots along the nanotube. As known in the art, electrical transport through quantum dots occurs through single electron conductance and is sensitive to adjacent gate voltages.

It should be noted that in the transistor operation as local tunable barrier, the drain and source leading to the active gated region(s) may in fact be segments of the nanotube itself rather than the metallic contacts. As a result, the capacitive coupling between the active area and the source and drain is reduced and may be lower relative to the capacitance between the active area (channel) and a region of the sample being measured. Thus, the transistor structure may operate as detector for electric fields, operating either as a QD based (SET) or as a tunable barrier. It should also be noted that the assembly technique provides the ability to deterministically select desired electronic characteristics (contact resistance, bandgap, absence of disorder) of the electrode arrangement and the nanotube thereon, thus providing desirably ideal transistor transconductance and on-off ratios providing desired sensitivity of this device operating as a local potential detector.

The transistor structure of the present invention may be utilized to provide a novel scanning probe microscope configuration, providing capability to detect and measure electric potentials and fields on a nanometric scale. The scanning microscope may generally include a probe providing capability to detect electric fields and electric potentials, the probe may be a transistor structure as described above, located on a cantilever and configured to enable scanning of a surface. It should be noted that various other, and possibly more complex, structures may be formed by the technique described above and may be used for electric potential detection. For example, the detector may be formed by plurality of transistor structures formed by a single nanotube or a two dimensional array of transistor structures formed by several nanotubes on a properly designed set of electrodes. Such detector configuration may provide parallel detection of electric field/potential within a region to thereby map a region of the sample simultaneously and avoid physical scanning of the sample. It should be understood that such multi-detector structure including plurality of nanotube-based transistor structures may be used to enhance scanning speed to provide for parallelized mapping of the sample. Additionally or alternatively, different sub-elements of the multi-detector above may be differently operated to thereby provide measurements of different characteristics of the sample and/or operated at different frequencies to detect AC variations of the sample.

The scanning microscope is generally configured similarly to the configuration shown in FIG. 3C with the required variations, i.e. a movable tip carrying the transistor structure (which operates as a probe) located in close proximity to a substrate to be inspected. It should be noted that the location of the probe and the substrate may be switched such that the probe is above the substrate.

Figure 5A:
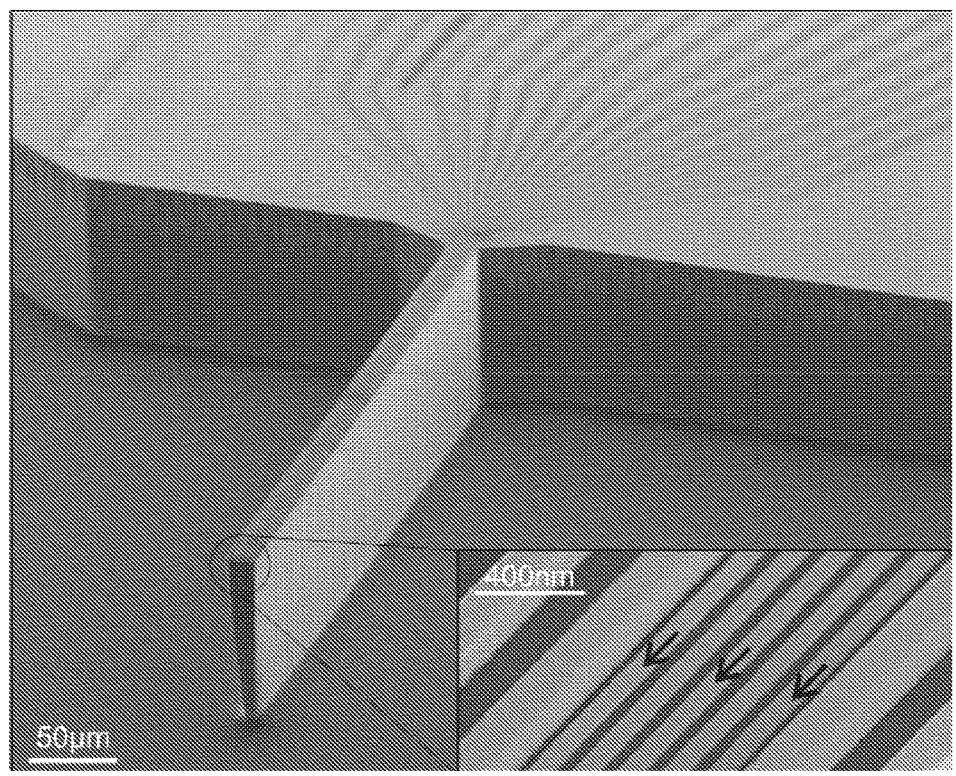
FIGS. 5A and 5B exemplify the use of the transistor structure as a probe for a scanning microscope.
Figure 5B:
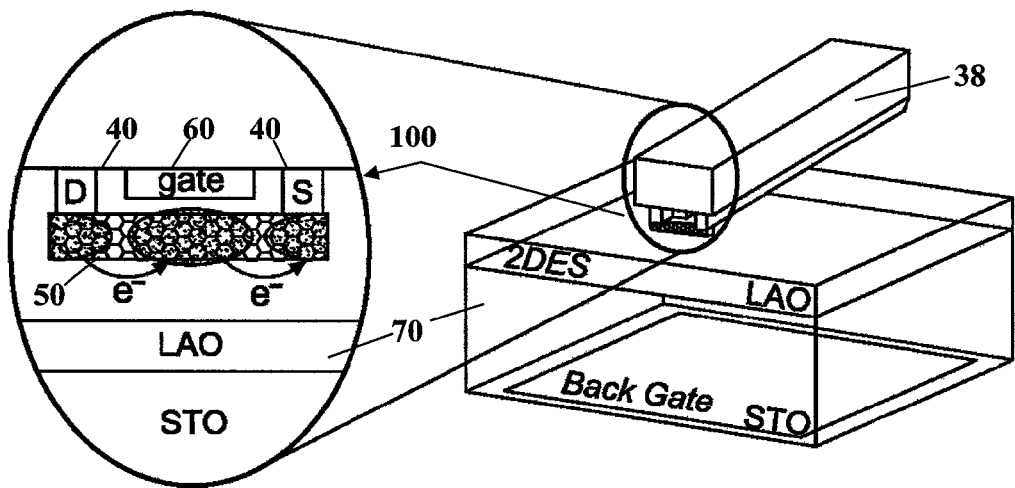

Reference is made to FIGS. 5A and 5B describing the use of the transistor structure of the present invention as a probe for a scanning microscope. FIG. 5A shows a SEM image of a deep etched pillar, carrying an electrode arrangement and a nanotube extending between at least source and drain electrodes and suspended above one or more gate electrodes. Inset in FIG. 5A shows a close-up view on the electrode arrangement and the nanotube extending thereon (marked with arrows). FIG. 5B illustrates the probe located above a substrate to be inspected. It should be noted that FIG. 5B illustrates a specific example of LaAlO$_3$/SrTiO$_3$ (LAO-STO) surface characterization using the scanning probe microscope of the invention. It should be noted that the scanning probe microscope of the invention may be used for characterization of general samples as required.

As shown in FIG. 5B, the transistor structure carried on the tip 38 of the scanning microscope is configured in accordance with the technique of the present invention as described above. More specifically, the transistor structure 100 carried thereon includes at least two elevated electrodes 40, operating as source and drain electrodes, and one or more electrodes 60 configured to operate as one or more gates (it should be noted that a plurality of gate electrodes may be operated together as a single gate). An isolated distinct nanotube 50 is extending between the elevated electrodes 40, being suspended above the gate electrodes 60. The nanotube 50 is preferably a single wall nanotube which may be metallic or semi-conducting (the first type allowing to form an operational detector at cryogenic temperatures, whereas the second type allowing to make an operational detector at room temperature or higher). The transistor carrying tip 38 is brought into close proximity with a substrate 70 to be inspected and is electrically operated to detect electric potentials and electric fields in its vicinity.

To provide measurements of surrounding electric potentials and electric fields, the detector is operated by providing appropriate electric bias on one or more of the local gates to thereby generate an appropriate electronic structure along the suspended nanotube. The electronic structure is configured as described above (being a QD or localized barrier along the channel) to provide sensitivity to changes in the electric potentials nearby. In both operational schemes, the active electronic structure along the nanotube is affected by the induced charge thereon as describe in equation 1 below:

$$Q = C\phi \quad \text{(equation 1)}$$

where C is the capacitance between the nanotube and its surrounding, preferably a substrate under study and $\phi$ is the electrostatic potential difference between them. The current through the device would change accordingly as:

$$\Delta I = g(C\Delta\phi + \phi\Delta C) \quad \text{(equation 2)}$$

where g=HC is the "gain" of the device, H is its transconductance, and $\Delta I$ is source-drain current variations. This enables simple detection of electric potential variation by monitoring of the source-drain current while scanning a sample with the transistor carrying probe. As shown in equation 2, the detector may also be operable to measure local capacitance, and if used at sufficiently high frequency also local polarizability (suitable measurement for insulators) or impedance (for conductors) as well as electric potential. The use of the scanning probe microscope according to the present invention may also provide several techniques enabling measurements of different elements associated with variation of the electric potential.

It should be noted that a typical transconductance of the transistor structure at room temperature may by about H~$10^{-5}$-$10^{-6}$ Amp/Volt, typical capacitances to a corresponding region of the sample being inspected (typically a few tens of nanometer in size) may be about C~0.1 aF (i.e. ~$10^{-19}$ Farad), and typical measured currents may be between sub picoamperes and up to several hundreds of nanoamperes. This provides for potential sensitivity being as high as 1 $\mu V/\sqrt{Hz}$ with spatial resolution of tens of nanometers. Thus the detector of the present invention provides detection sensitivity being about 3 orders of magnitude higher than the state of the art detection systems, e.g. the AFM based Kelvin-probe microscopy.

Figure 6:
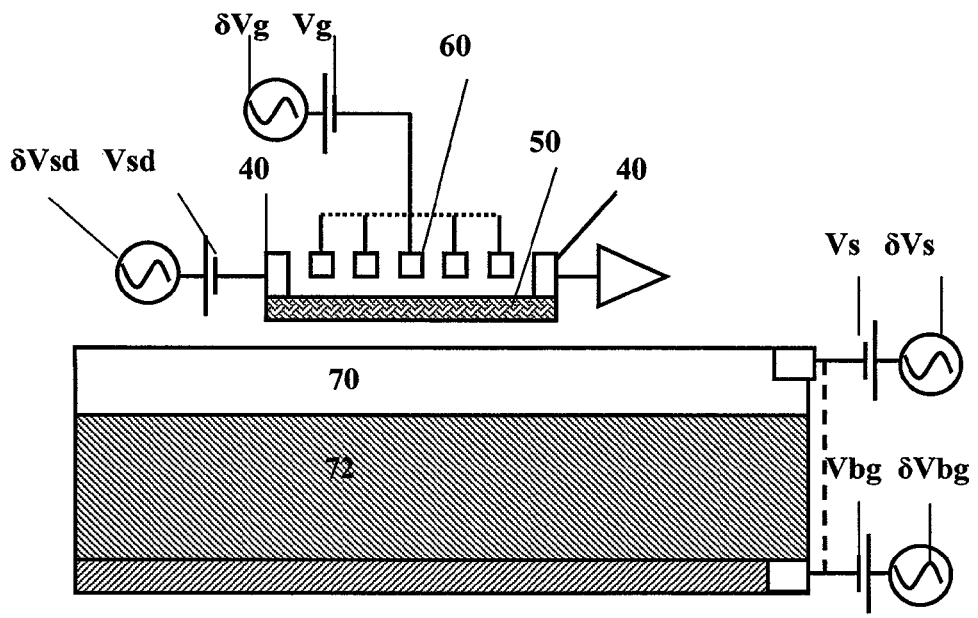
FIG. 6 illustrates a scanning probe configuration and an example of measurement technique suitable for use with the scanning probe microscope according to some embodiments of the present invention.

Reference is made to FIG. 6 illustrating an example of measurement technique suitable for use with the scanning probe microscope of the invention. As shown, a transistor structure 100 is located in close proximity above a surface 70 to be measured. At least one of the one or more gate electrodes 60 applies appropriate voltage to form an active region along the nanotube 50, being either a QD or a localized barrier. As shown in the figure in dashed line, the gate voltage may be applied on any set of the one or more gate electrodes 60. In order to provide measurement of various terms associated with the electric potential, the sample and the transistor structure may be connected to additional voltage sources. $V_{sd}$ is the source-drain voltage. $V_s$ is a voltage applied onto the sample and used to vary electrochemical potential of the sample relative to the transistor structure. Addition of AC signal on top of any one of the applied voltages, $\delta V_{sd}$, $\delta V_g$, $\delta V_s$ and $\delta V_{bg}$, enables detection of current variation in response to any one of the applied voltages and thus simultaneous extraction of the individual capacitances between the detector and the various gates on which the AC potentials are applied. It should be noted that parallel measurements may be performed by setting any group of the voltage variations to different frequencies thereby enabling separation of the resulting effects on the source-drain current.

It should be noted that, different derivatives of the source-drain current with respect to the selected (different) elements of applied AC voltage provide corresponding physical quantities associated with the sample. Utilizing AC voltages of different frequencies on different elements of the sample under study provides for simultaneous measuring of electric potential, capacitance, polarizability (for insulators) and inductance (for conductors) of these elements simultaneously. The detector of the invention, in either one of its operational schemes (QD and local barrier) provides varying response to electric potential. This response, being dependent function of the transconductance, varies in accordance with the working point of the detector. As described above, the working point of the detector device is set by selected DC voltage applied on each of the local gates. Additional potential difference between the detector and the sample (i.e. DC voltages on the substrate under study) may also vary the working point of the detector. However, appropriate gauge of the local gates voltages allows for normalizing out the varying working point effects, thus providing a quantitatively-accurate measurement independent of shifts in the working point of the detector. To this end, the transistor structure utilizes a fixed distance between the one or more local gates and the active detection region (QD or local barrier) of the suspended nanotube. The effects of the AC voltage on this gate on the source-drain current enable direct detection of the working point of the device (given by its transconductance to the local gates).

More specifically, normalization of AC responses measured in accordance with any electrical contact ($\delta V_{sd}$, $\delta V_g$, $\delta V_s$ and $\delta V_{bg}$) by the response to AC excitation of the local gate(s), may normalizes out working point variations and thus provide a ratio between the capacitance of the detector to a specific element in the sample and the capacitance between the detector and one of its the local gates. Since these measurements may be done simultaneously, this normalization may be performed instantaneously.

Thus, an appropriate feedback loop may be provided, to vary the local gate(s) DC voltage with respect to the AC response of the source-drain current, to thereby shift the working point to a desired value. Additionally or alternatively a feedback loop may be provided to vary the electric voltage applied on the inspected substrate with respect the source-drain current AC response. This allow maintaining the working point during scanning while allowing DC potentials associated with the inspected substrate to be measured. The voltage applied by this feedback loop exactly compensates the potential shift induced by the substrate under study, and thus its magnitude tracks the potential of the substrate, allowing for direct and quantitative probing of the local potential in the substrate.

Figure 7A:
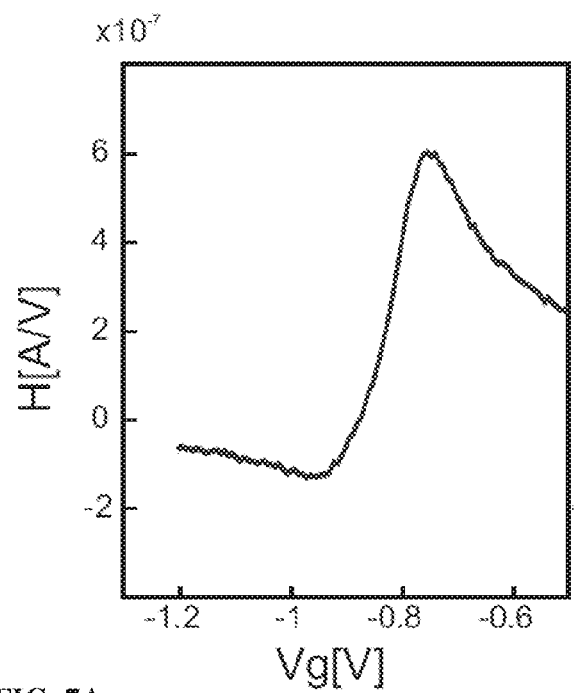
FIGS. 7A-7B illustrate respectively experimental measurements of transconductance along the transistor structure in response to local gate excitation of different voltages.
Figure 7B:
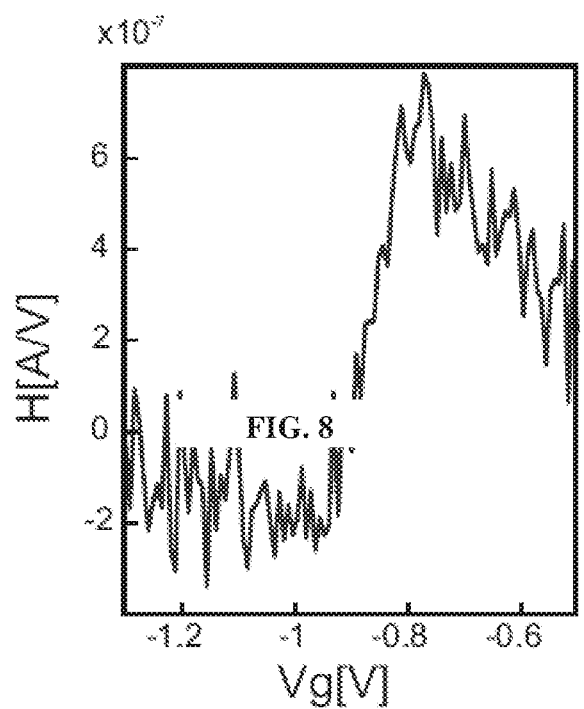

The operation of the local tunable barrier of the transistor structure is exemplified in FIGS. 7A and 7B showing respectively experimental measurements of the transconductance as a function of the voltage on the local gate performed on a transistor structure configured as a local tunable barrier according to embodiments of the present invention. The figures show transconductance through the local tunable barrier which is measured at room temperature. In FIG. 7A, the barrier is configured to be about 200 nm long and is defined by appropriate voltage applied to a local gate located beneath a 1 µm-long suspended nanotube. The transconductance is measured with 1 mV excitation on the local gate while the source-drain bias of 150 mV. In the example of FIG. 7B the measurement is provided by excitation of 50 µV on the corresponding local gate, using lock-in measurement at a frequency of 9000 Hz, a time constant of 100 ms and filter slope of 24 dB/oct, translating to an effective noise band width of ~1 Hz. As can be seen in the figures, the transconductance response of the transistor structure is substantially similar even for excitations being smaller by orders of magnitude. More specifically the local barrier provided by the transistor structure of the present invention provides a potential sensitivity better than 10 µV/√Hz, which is more than two orders of magnitude higher than the state of the art, e.g. that Kelvin probe microscope (1-20 mV/√Hz).

Figure 8A:
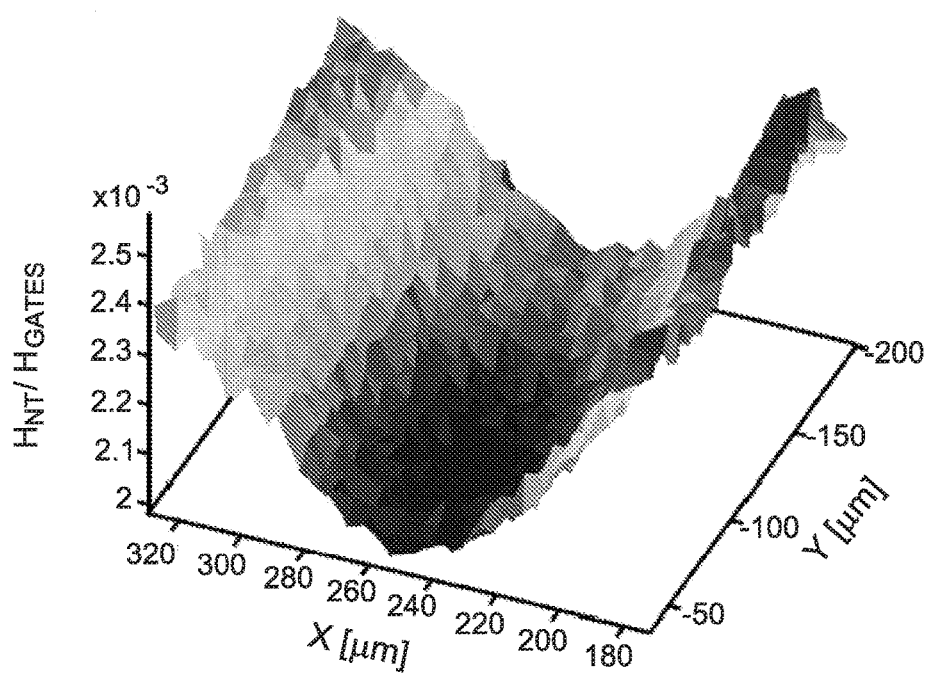
FIGS. 8A-8B illustrate two examples of surface map of silicon trench experimentally measured by a scanning probe according to the present invention.
Figure 8B:
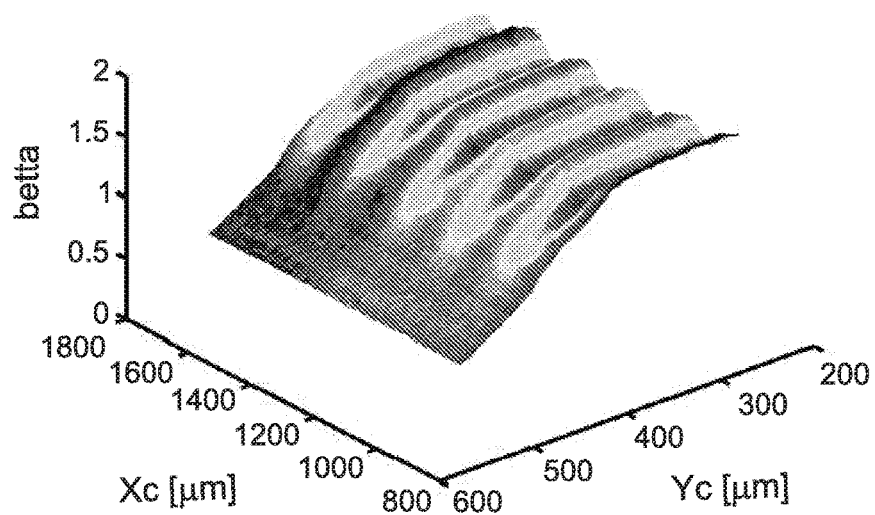

Microscopic mapping of the surface topography of a sample through local capacitance measurement in the scanning microscope configured according to embodiment of the present invention are exemplified in FIGS. 8A-8B. These figures show real-space, room temperature, images of a trench structure provided on silicon samples and obtained using the above local tunable barrier device as a probe in a scanning microscope. As shown, FIG. 8A illustrates the structure of a single trench in the silicon sample and FIG. 8B shows a portion of the surface including several trenches. In both measurements the detector was operated to measure capacitance between the local barrier of the transistor structure and the surface of the sample under study as function of the spatial coordinate. In the specific measurement in the figure the detector is separated by 50 µm above the sample providing resolution of a few tens micrometers. It should be noted that higher resolution may be provided by operating the detector at closer distances from the sample. Accordingly, the maximal resolution of the detector according to the present invention is defined by the physical size of the tunable harrier or QD generated along the suspended nanotube.

Thus, the present invention provides a novel technique for producing an electronic device utilizing one or more distinct nanotubes. The technique enables direct, deterministic and accurate deposition of a selected nanotube at a desired location on electronic circuits. Additionally the present invention provides for a unique transistor structure utilizing a one or more nanotubes, arranged in a discrete fashion (i.e. distinct nanotubes). Such transistor device may be used for probing electrostatic potential landscape with nano-scale spatial resolution and thus provide a novel scanning probe microscope system as described above.

Those skilled in the art will readily appreciate that various modifications and changes can be applied to the embodiments of the invention as hereinbefore described without departing from its scope defined in and by the appended claims.

The invention claimed is:

1. A method for use in construction of an electronic device, the method comprising:
   providing one or more nanotubes grown on a surface of a first substrate;
   providing a desired electrode arrangement fabricated on a surface of a second substrate, said electrode arrangement comprises at least two elevated source and drain electrodes and one or more gate electrodes located in between said elevated source and drain electrodes;
   bringing the electrode arrangement on the second substrate to close proximity with the first substrate such that surfaces of the first and second substrates face each other;
   scanning said first substrate with said electrode arrangement and determining contact of electrodes of the electrode arrangement with a nanotube located on the first substrate;
   detaching said nanotube from the first substrate to provide a transistor structure comprising an isolated nanotube bridging said at least two elevated source and drain electrodes.

2. The method of claim 1, wherein fabricating the desired electrode arrangement comprises fabricating said electrode arrangement on a tip-like structure of said second substrate to thereby allow scanning said tip carrying the electrode arrangement along a surface of the first substrate.

3. The method of claim 1, wherein said determining of the contact of electrodes of the electrode arrangement with a nanotube located on the first substrate comprises electrical measurement between said first substrate and said second substrate or between two elevated electrodes of said second substrate.

4. The method of claim 3, wherein said electrical measurement comprises resistance measurement comprising at least one of the following: resistance measurement between a specific electrode of the electrode arrangement and the first substrate; resistance measurement between two electrodes located on a cantilever being in electrical contact with the nanotube.

5. The method of claim 1, wherein said first substrate comprises at least two adjacent trenches, and wherein said one or more nanotubes grown on the first substrate is suspended over at least one of said two adjacent trenches.

6. The method of claim 1, wherein said desired electrode arrangement comprises at least two external elevated electrodes, said detaching of the nanotube from the first substrate comprises transmitting appropriate electrical current between one of said external electrodes and a corresponding one of the elevated electrodes to thereby cut the nanotube to be confined between said elevated source and drain electrodes.

7. The method of claim 1, further comprising determining electrical properties of said nanotube in contact with said electrode arrangement, and
detaching the electrode arrangement from said nanotube if said electrical properties of said nanotube are insufficient, or
conducting said detaching of said nanotube from said first substrate if said electrical properties of said nanotube are sufficient, to provide said transistor structure.

8. The method of claim 7, wherein after detaching from said nanotube having insufficient electrical properties, said method further comprises scanning along said first substrate for additional nanotubes along said first substrate.

9. The method of claim 1, wherein said electrode arrangement comprises a plurality of the contact electrodes of different lengths, said scanning of the first substrate with said electrode arrangement comprising touching a selected nanotube on the first substrate and determining a longitudinal location of the nanotube along the electrode arrangement.

10. The method of claim 9, comprising:
determining whether said longitudinal location of said nanotube is desired, and if it is not, detaching said nanotube from said electrode arrangement to provide contact on a different longitudinal location of said nanotube.

11. The method of claim 9, comprising determining an angular orientation of a nanotube being in contact with said electrode arrangement in accordance with electrical contact with said plurality of electrodes of different lengths.

12. The method of claim 1, wherein the second substrate comprises a plurality of parallel electrode arrangements, enabling attaching of a single nanotube to said plurality of electrode arrangement.

13. The method of claim 1, comprising annealing the contact of said nanotube with said electrodes of the electrode arrangement, said annealing comprising applying electric current between selected electrodes of said electrode arrangement.

14. The method of claim 1, comprising cleaning said electrode arrangement, said cleaning comprising utilizing plasma etching on the first substrate thereby providing desirably conducting electric contacts on said electrode arrangement.

15. A system configured for scanning the surface of a sample, the system comprising: a cantilever like tip carrying a scanning probe and a scanning unit comprising moving elements and configured to enable movement of the cantilever like tip along at least three perpendicular axes; wherein said scanning probe comprises an electrode arrangement comprising source and drain electrodes and at least one gate electrode located between the source and drain electrodes, and at least one distinct nanotube extending between the source and drain electrodes and being suspended above said at least one gate electrodes, such that a current through said at least one distinct nanotube is indicative of electrical properties of said surface of a sample.

* * * * *